United States Patent [19]
Sekimoto et al.

[11] Patent Number: 5,363,215
[45] Date of Patent: Nov. 8, 1994

[54] IMAGE PROCESSING APPARATUS HAVING FUZZY SET CALCULATING MEANS

[75] Inventors: Takashi Sekimoto, Tokyo; Kunio Nakano; Toshiya Eguchi, both of Hino, all of Japan

[73] Assignee: Konica Corporation, Tokyo, Japan

[21] Appl. No.: 944,784

[22] Filed: Sep. 15, 1992

[30] Foreign Application Priority Data

Sep. 18, 1991 [JP] Japan .................................. 3-238002

[51] Int. Cl.$^5$ ...................... H04N 1/387; G03G 15/01
[52] U.S. Cl. ..................... 358/465; 358/458; 355/327
[58] Field of Search .................. 358/465, 98, 458, 462, 358/444, 466, 467, 447, 448; 395/51, 900, 11, 61, 54, 76, 12, 75, 3; 382/41, 6, 14, 54, 22, 52; 355/327, 208

[56] References Cited

U.S. PATENT DOCUMENTS

| | | | |
|---|---|---|---|
| 5,148,089 | 9/1992 | Adachi et al. | 318/66 |
| 5,191,638 | 3/1993 | Wakami et al. | 395/51 |
| 5,193,144 | 3/1993 | Tsutsumi et al. | 395/76 |
| 5,243,666 | 9/1993 | Hasegawa et al. | 358/98 |
| 5,245,445 | 9/1993 | Fujisawa | 358/458 |
| 5,262,833 | 11/1993 | Fukushima et al. | 355/327 |

FOREIGN PATENT DOCUMENTS

0454495A1 10/1991 European Pat. Off. .
2149611A 6/1985 United Kingdom .

OTHER PUBLICATIONS

Ting et al., "Pre-Processing Techniques for Digital Facsimile", 1978 International Conference on Communications, vol. 3, pp. 4851–4856, Jun. 4–7, 1978.

"Method for Producing a High Resolution Image", IBM Technical Disclosure Bulletin, vol. 31, No. 5, Oct. 1988.

Primary Examiner—Paul Ip
Attorney, Agent, or Firm—Finnegan, Henderson Farabow, Garrett & Dunner

[57] ABSTRACT

An apparatus for converting an image data with a threshold value into a bi-level data. The apparatus includes a processing circuit for processing image data of pixels neighboring a target pixel to generate membership functions and for obtaining a fuzzy set from the membership functions, and a threshold value generation circuit for generating a threshold value on the basis of the fuzzy set. The threshold value is used to convert the image data of the target pixel.

3 Claims, 4 Drawing Sheets

NOTCH

LINE

ORIGINAL IMAGE DATA
(LEVELS)

BINARIZATION BY FIXED
THRESHOLD VALUE
(THRESHOLD VALUE C = 31)

BINARIZATION BY THRESHOLD VALUE
ACCORDING TO THE INDENTION
(THRESHOLD VALUE Cf = 35)

N : NOTCH

N

N

N

IMAGE PROCESSING APPARATUS HAVING FUZZY SET CALCULATING MEANS

BACKGROUND OF THE INVENTION

The present invention relates to an image processing apparatus that is preferably applied to a facsimile device, and more particularly to an image processing apparatus in which the number of notches (unprinted pixels in a line of printed pixels) can be reduced.

For example, in a facsimile device, the following operations are generally performed: image data which has been read in an image reading section, is converted into bi-level data in accordance with a predetermined threshold value; the converted data is appropriately coded; and the coded data is transmitted to the other party.

When image data is converted into bi-level data, notch N shown in FIG. 5 occurs frequently due to the fluctuation of the system.

As can be seen from FIG. 5, notch N is defined as follows: on a boundary between 0 and 1 bi-level data, one pixel data on one side is projected to the other side. When the aforementioned notch N is caused, the correlation of data in the longitudinal or lateral direction is interrupted, so that the coding efficiency is lowered. Accordingly, a long period of corresponding time is required.

In order to solve the aforementioned problems, various image processing methods to remove notch N have been proposed. For example, according to one method carried out before binarization, a smoothing filter such as a median filter is used. Further, according to another method carried out after binarization, pattern matching is conducted.

When the median filter is adopted, the number of notches N can be reduced, however, its effect is small. Further, in the case where fine lines are included in a window, they can not be recognized. That is, the original data is lose by the filtering operation, and the resolution is deteriorated.

The method of pattern matching is carried out after binarization. Therefore, this method is not appropriate to process multi-level data.

The present invention has been achieved to solve the aforementioned problems. It is a primary object of the present invention to provide an image processing apparatus which can positively prevent the occurrence of notches during the process of binarization and further prevent the deterioration of resolution.

SUMMARY OF THE INVENTION

In order to solve the aforementioned problems, the present invention is to provide an image processing apparatus that converts image data inputted from an image reading apparatus, into bi-level data in accordance with a predetermined threshold value, wherein said image processing apparatus comprises: a membership function generating means which calculates membership functions of at least 4 pixels located in the upper and lower sides and in the right and left of a pixel to be converted into bi-level data; a fuzzy set calculating means which calculates a fuzzy set using the membership functions of at least 4 pixels; and a threshold value generating means which calculates the threshold value of image data in accordance with the fuzzy set.

DETAILED DESCRIPTION OF THE PREFERRED EMBODIMENT

Figure 4A:
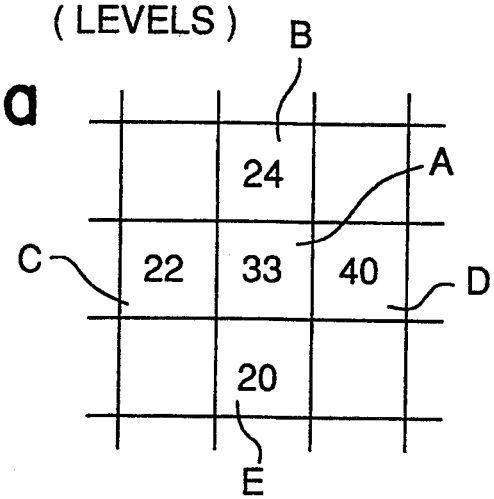
FIGS. 4a–4c are schematic illustrations explaining original image data and binarized data.

Image data (shown in FIG. 4(a)) which has been read by an image reading means 1 in 64 gray-level data, is supplied to a membership function calculating means 2. In the membership function calculating means 2, membership function $\mu i$ (i=B to E) of 4 pixels B, C, D and E disposed around target pixel A, is calculated by the following equation (1).

These membership functions $\mu B$ to $\mu E$ are supplied to a fuzzy set calculating means 4. In the fuzzy set calculating means 4, a fuzzy set $\mu$ can be calculated by the following equation (2). This fuzzy set $\mu$ is supplied to a threshold value generating means 5. In the threshold value generating means 5, threshold value Cf of pixel A is calculated by the following equation (5).

Figure 4B:
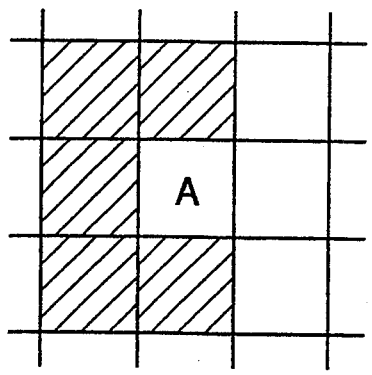
Figure 4C:
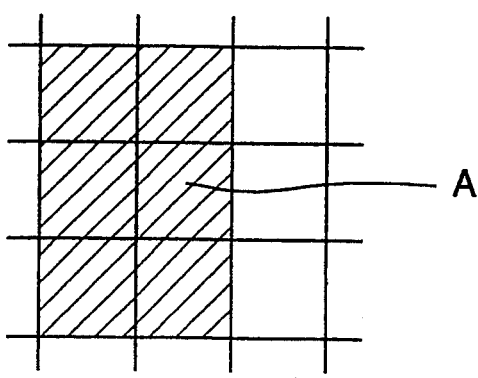
Figure 5A:
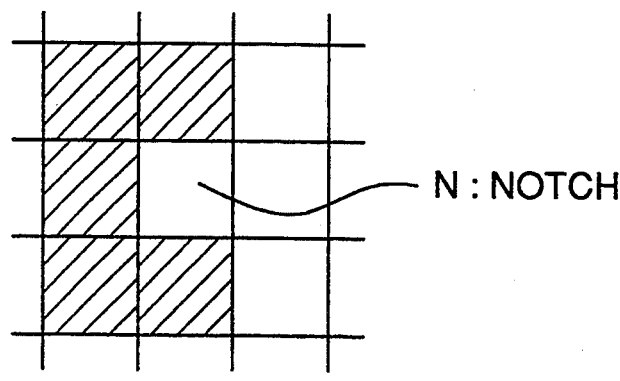
FIGS. 5a–5d are schematic illustrations explaining a notch pattern.
Figure 5B:
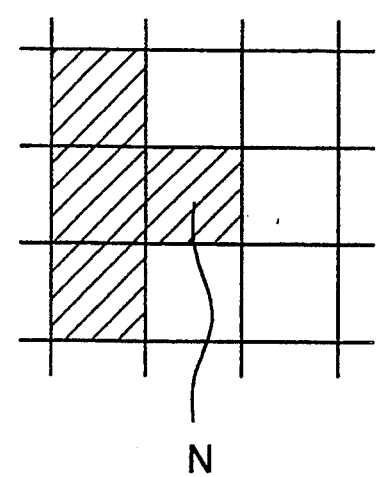
Figure 5C:
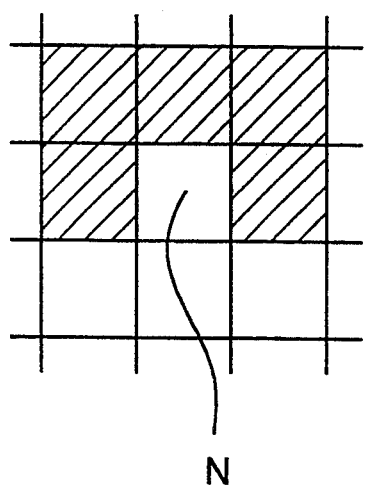
Figure 5D:
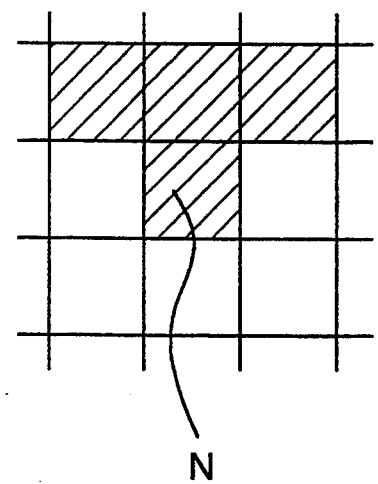

Original image data A which was read by the image reading means 1, and threshold value Cf which was generated by the threshold value generating means 5, are supplied to a binarizing means. In the binarizing means, original image data A is binarized as shown in FIG. 4(c).

In the manner described above, all data is converted into bi-level data. For example, the bi-level data is coded by a *Modified Haffman coding System*, and sent to a communication line from a communicating means 7 so that the data is transmitted to the other party.

With reference to the attached drawings, an example will be explained in which the image processing device of the present invention is applied to a facsimile device.

Figure 1:
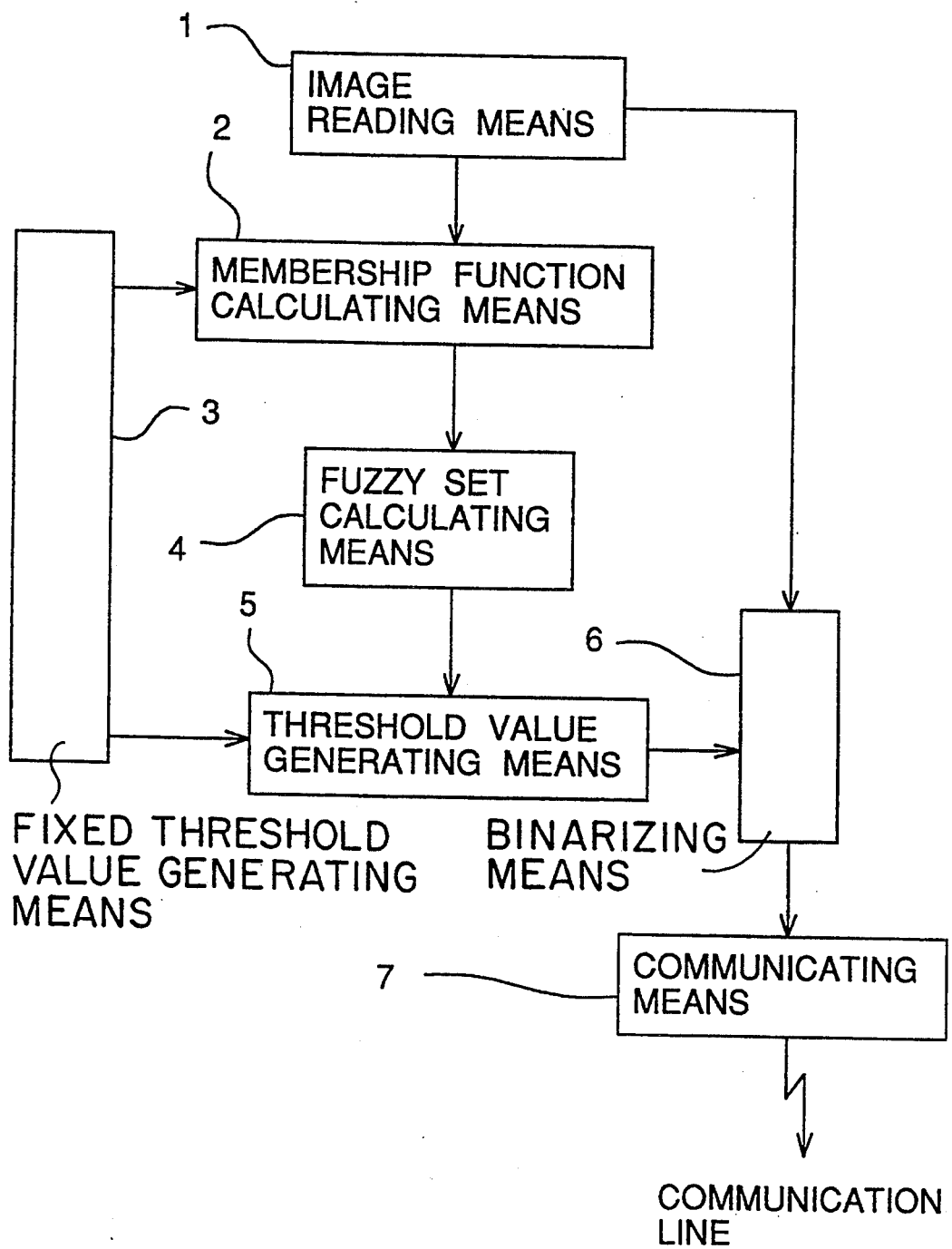
FIG. 1 is a functional block diagram of a facsimile device to which the image processing apparatus of the present invention is applied.
Figure 2:
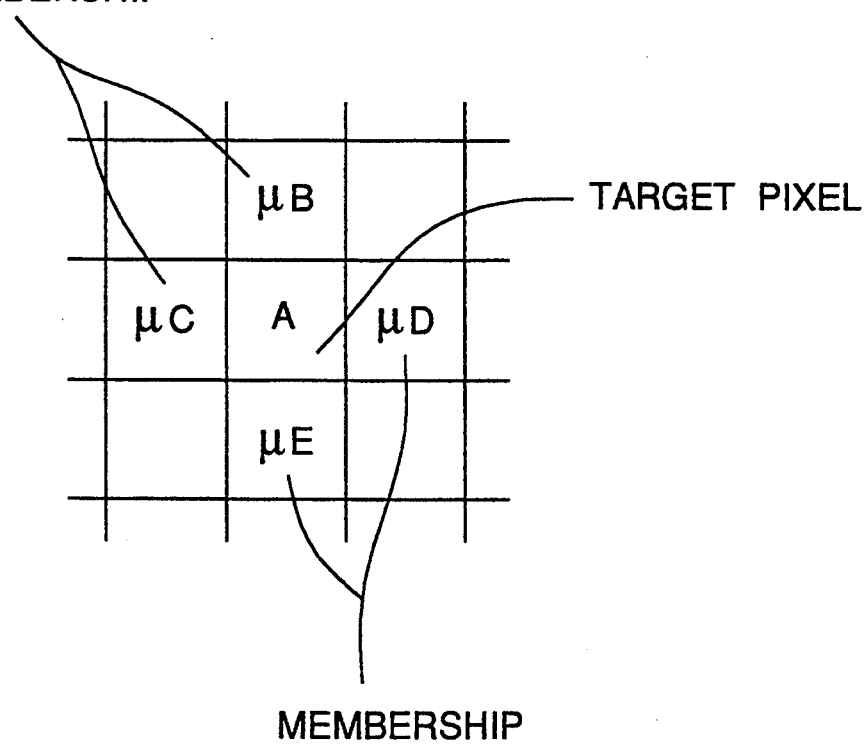
FIG. 2 is a schematic illustration explaining the membership of pixels.

FIG. 1 is a functional block diagram of a facsimile device to which the image processing apparatus of the present invention is applied. In FIG. 1, numeral 1 is an image reading means which reads an image on a document. Numeral 2 is a membership function calculating means. The membership function calculating means calculates membership function $\mu i$ (i=B to E) of 4 pixels B to E disposed around target pixel A as shown in FIG. 2, by the following equation (1).

$$\mu i = TH - Di + P1 \tag{1}$$

where $\mu i = 0$ (In the case of $TH - Di + P1 \leq 0$)

$\mu i = TH$ (In the case of $TH - Di + P1 > TH + 1$)

In this case, TH is a fixed threshold value, Di is a number of gradation of pixel i, and P1 is a parameter of the membership function.

In FIG. 1, numeral 3 is a fixed threshold value generating means, which generates fixed threshold value TH used in equation (1). Numeral 4 is a fuzzy set calculating means, which calculates fuzzy set $\mu$ by the following equation (2) from membership functions $\mu B$ to $\mu E$ of 4 pixels B to E disposed around target pixel A.

$$\mu = \mu1 \vee \mu2 \quad (2)$$

where $$\mu1 = (\mu B \vee \mu E) \wedge (\mu C \vee \mu D) \quad (3)$$
$$\mu2 = (\mu B \wedge \mu E) \vee (\mu C \wedge \mu D) \quad (4)$$

In these formulas, is a logical multiplication in a fuzzy operation, which means selction of the smallest value, and $\vee$ is a logical sum in a fuzzy operation, which means selection of the largest value.

Figure 3A:
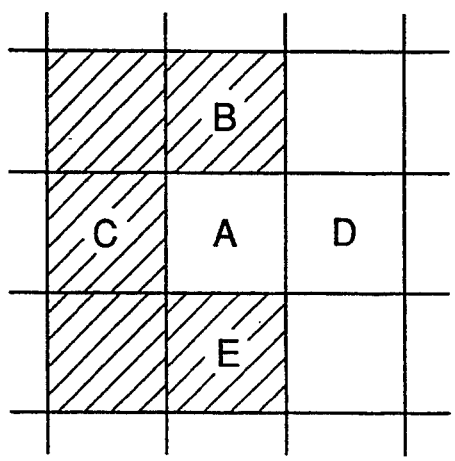
FIGS. 3a and 3b are schematic illustrations explaining a notch and a line.
Figure 3B:
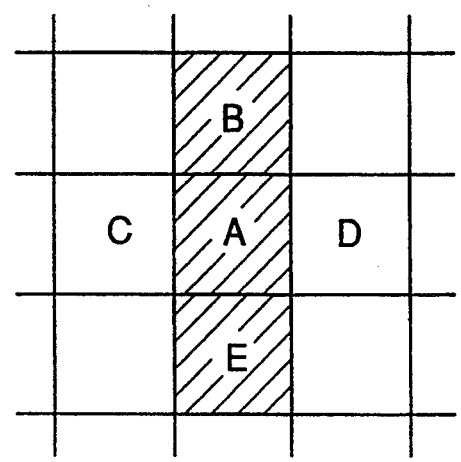

As shown in FIG. 3(a), $\mu1$ is a fuzzy set in the case where target pixel A is a notch. As shown in FIG. 3(b), $\mu2$ is a fuzzy set in the case where target pixel A is part of the composition of a line. Then, fuzzy set $\mu$ can be rewritten as follows: $\mu = \text{Max}[\text{Min}\{\text{Max}(\mu B, \mu E), \text{Max}(\mu C, \mu D)\}, \text{Max}\{\text{Min}(\mu B, \mu E), \text{Min}(\mu C, \mu D)\}]$.

In this equation, for example, Max($\mu B$, $\mu E$) means selection of the larger one from $\mu B$ and $\mu E$, and in the same manner, Min($\mu B$, $\mu E$) means selection of the smaller one from $\mu B$ and $\mu E$.

Numeral 5 shown in FIG. 1 is a threshold value generating means, which calculates threshold value Cf to binarize target pixel A by the following equation (5).

$$Cf = TH + \tfrac{1}{2} \times \mu - P2 \quad (5)$$

In the above equation, P2 is a threshold parameter to adjust the density of the entire image to the white side or to the black side. Fixed threshold value TH is supplied to this threshold value generating means 5 from the fixed threshold value generating means 3.

Numeral 6 is a binarizing means, which binarizes target pixel A supplied from the image reading means 1, in accordance with threshold value Cf. Numeral 7 is a communicating means, which encodes binarized image data by a *Modified Huffman coding System*, and transmits the data to the other party through the communication line.

An example will be explained here in which image data is binarized in the facsimile device. That is, a case will be explained in which pixel A in a notch as shown in FIG. 4(a) is binarized, wherein the image data is read in 64 gray-levels data. Numerals shown in the drawing are gray-level data when each pixel is read.

First, membership functions of pixels B to E are calculated by equation (1). When it is assumed that fixed threshold value TH=31 (the middle of 64 gradations) and parameter P1=16 (the fluctuation of the fixed threshold value is in the range of TH±16), membership data $\mu B$ becomes as follows: $\mu B = 23$ (TH−Di+16=31−24+16=23). In the same manner, membership functions of pixels C, D and E become as follows: $\mu C = 25$, $\mu D = 27$, and $\mu E = 7$.

When these membership functions $\mu B$, $\mu C$, $\mu D$, and $\mu E$ are substituted in equation (2), the following fuzzy set $\mu$ can be obtained: $\mu = \{(23 \vee 27) \wedge (25 \vee 27)\} \vee \{(23 \vee 27) \vee (25 \wedge 7)\} = (27 \wedge 25) \vee (22 \vee 7) = 25 \vee 22 = 25$.

Consequently, fuzzy set Cf is found from equation (5) as follows: $Cf = 31 + \tfrac{1}{2} \times 25 - P2$. When P2=8, $Cf = 31 + \tfrac{1}{2} \times 25 - 8 = 35$ (In this case, fractions are discarded.).

In the aforementioned manner, threshold value Cf of pixel A is set. In the case where pixel A having a gradation of 33 is binarized, values not more than the threshold value become black. When binarization is performed by fixed threshold value TH=31 in the conventional manner, pixel A becomes a white notch as shown in FIG. 4(b). However, in this example, pixel A becomes black as shown in FIG. 4(c), so that the occurrence of a notch can be prevented.

As explained above, according to the present invention, the occurrence of notches can be prevented in this manner: a threshold value used when image data is binarized which was read in the multi-gray-level, is changed in accordance with the circumstances of pixels disposed around a target pixel.

Accordingly, the present invention can provide the following effects: the occurrence of notches can be prevented without deteriorating resolution.

What is claimed is:

1. An apparatus for converting an image having a plurality of pixels obtained from an image reading device, each pixel having a density, the apparatus comprising:

means for processing densities of at least four pixels neighboring a target pixel and producing membership data for each neighboring pixel;

means for forming a fuzzy set from the membership data of the four neighboring pixels and for performing a fuzzy operation to determine optimum membership data;

means for determining a threshold value from the optimum membership data; and means for comparing the density of the target pixel with the threshold value and converting the density of the target pixel into bi-level data.

2. The apparatus of claim 1, wherein the processing means includes means for processing at least four pixels at up, lower, right and left sides of the target pixel respectively.

3. The apparatus of claim 1, further comprising means for providing a fixed threshold value wherein the determining means changes the fixed threshold value on the basis of the fuzzy set.

* * * * *

UNITED STATES PATENT AND TRADEMARK OFFICE
CERTIFICATE OF CORRECTION

PATENT NO. : 5,363,215
DATED : November 08, 1994
INVENTOR(S) : Takashi SEKIMOTO et al It is certified that error appears in the above-indentified patent and that said Letters Patent is hereby corrected as shown below:

Claim 2, Column 4, Line 47, "up" should read --upper--.

Signed and Sealed this

Thirteenth Day of June, 1995

Attest:

BRUCE LEHMAN

*Attesting Officer*     *Commissioner of Patents and Trademarks*